(12) United States Patent
Mok et al.

(10) Patent No.: US 8,151,446 B2
(45) Date of Patent: Apr. 10, 2012

(54) APPARATUS FOR MANUFACTURING PRINTED CIRCUIT BOARD

(75) Inventors: Jee-Soo Mok, Yongin-si (KR); Je-Gwang Yoo, Yongin-si (KR); Yoong Oh, Suwon-si (KR); Jong-Seok Bae, Busan (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1050 days.

(21) Appl. No.: 12/076,223

(22) Filed: Mar. 14, 2008

(65) Prior Publication Data

US 2009/0049683 A1    Feb. 26, 2009

(30) Foreign Application Priority Data

Aug. 24, 2007   (KR) .................. 10-2007-0085774

(51) Int. Cl.
*B23P 19/04* (2006.01)
(52) U.S. Cl. .............. 29/728; 29/831; 156/582
(58) Field of Classification Search .............. 29/728, 29/825, 830, 831, 895.32, 843, 846, 851; 101/167, 425; 156/209, 555, 582
See application file for complete search history.

(56) References Cited

U.S. PATENT DOCUMENTS 5,390,598 A * 2/1995 Stauffer ................ 101/167
6,435,246 B1 * 8/2002 Kerr ..................... 156/555
6,507,995 B1 * 1/2003 Sasaoka et al. ............ 29/738

FOREIGN PATENT DOCUMENTS

| JP | 3-225644 | 10/1991 |
| JP | 7-329266 | 12/1995 |
| JP | 8-183146 | 7/1996 |
| JP | 10-260551 | 9/1998 |
| JP | 11-340622 | 12/1999 |
| JP | 2000-91735 | 3/2000 |
| JP | 2000-347529 | 12/2000 |
| JP | 2002-204047 | 7/2002 |
| JP | 2003-218526 | 7/2003 |

OTHER PUBLICATIONS

Office Action mailed on Jul. 31, 2008 and issued in corresponding Korean Patent Application No. 10-2007-0085774.
Japanese Office Action issued Jul. 13, 2010 in corresponding Japanese Patent Application 2008-097316.

* cited by examiner

*Primary Examiner* — Donghai D. Nguyen

(57) ABSTRACT

An apparatus for manufacturing a printed circuit board that uses conductive bumps to interconnect layers includes: a conveyor unit, which is configured to transport a board that has the conductive bumps formed on one side; an upper roller and a lower roller, which press the board and an insulator together; an elastic coating layer, formed on a surface of the upper roller; and a cleaning device, which removes impurities from a surface of the elastic coating layer. The apparatus does not require a separate device for performing a cushioning function and a detaching function between the bumps and the rollers, and the rollers can be kept clean using a cleaning device.

2 Claims, 2 Drawing Sheets

APPARATUS FOR MANUFACTURING PRINTED CIRCUIT BOARD

CROSS-REFERENCE TO RELATED APPLICATIONS

This application claims the benefit of Korean Patent Application No. 10-2007-0085774 filed with the Korean Intellectual Property Office on Aug. 24, 2007, the disclosure of which is incorporated herein by reference in its entirety.

BACKGROUND

1. Technical Field

The present invention relates to an apparatus and a method for manufacturing a printed circuit board.

2. Description of the Related Art

In manufacturing a printed circuit board, the methods for interconnecting layers can include plating methods, in which holes are processed, such as by mechanical drilling or laser drilling, and then electroplating is performed, paste-filling methods, in which the holes are filled in with conductive paste, or Buried Bump Interconnection Technology ("B2it") methods, in which conductive bumps are formed that are made to penetrate the insulation material.

Among these methods, the use of a B2it method may require a penetration apparatus to force the conductive bumps to penetrate the insulation material. Such penetration apparatus may face difficulties in implementing the penetration as the number of conductive bumps is increased. There is a demand also for apparatus that provides cushioning, as well as for apparatus that efficiently implements detachability with respect to the conductive bumps and the insulation material.

SUMMARY

An aspect of the invention is to provide an apparatus and a method for manufacturing a printed circuit board, which does not require a separate device for performing a cushioning function and a detaching function between the bumps and the rollers, and with which the rollers can be kept clean.

One aspect of the invention provides an apparatus for manufacturing a printed circuit board that uses conductive bumps for interconnection between layers. The apparatus includes: a conveyor unit, which is configured to transport a board that has the conductive bumps formed on one side; an upper roller and a lower roller, which press the board and an insulator together; an elastic coating layer, formed on a surface of the upper roller; and a cleaning device, which removes impurities from a surface of the elastic coating layer.

The elastic coating layer may contain silicon (Si) or Teflon, the cleaning device may include a cleaning roller that engages with the upper roller, and a thickness of the elastic coating layer may be greater than a height of the conductive bumps. The apparatus may further include a preheater for preheating the insulator.

Another aspect of the invention provides a method of manufacturing a printed circuit board that employs conductive bumps for interconnection between layers. The method includes: forming conductive bumps on one side of a board; loading an insulator onto the one side of the board; and pressing the insulator and the board together, where the pressing is performed by a lower roller, which supports the board, and an upper roller, which engages with the lower roller, and on a surface of which an elastic coating layer is formed.

The elastic coating layer may contain silicon (Si) or Teflon, and a thickness of the elastic coating layer may be greater than a height of the conductive bumps. Also, the method may further include preheating the insulator, before the pressing.

Additional aspects and advantages of the present invention will be set forth in part in the description which follows, and in part will be obvious from the description, or may be learned by practice of the invention.

DETAILED DESCRIPTION

Figure 1:
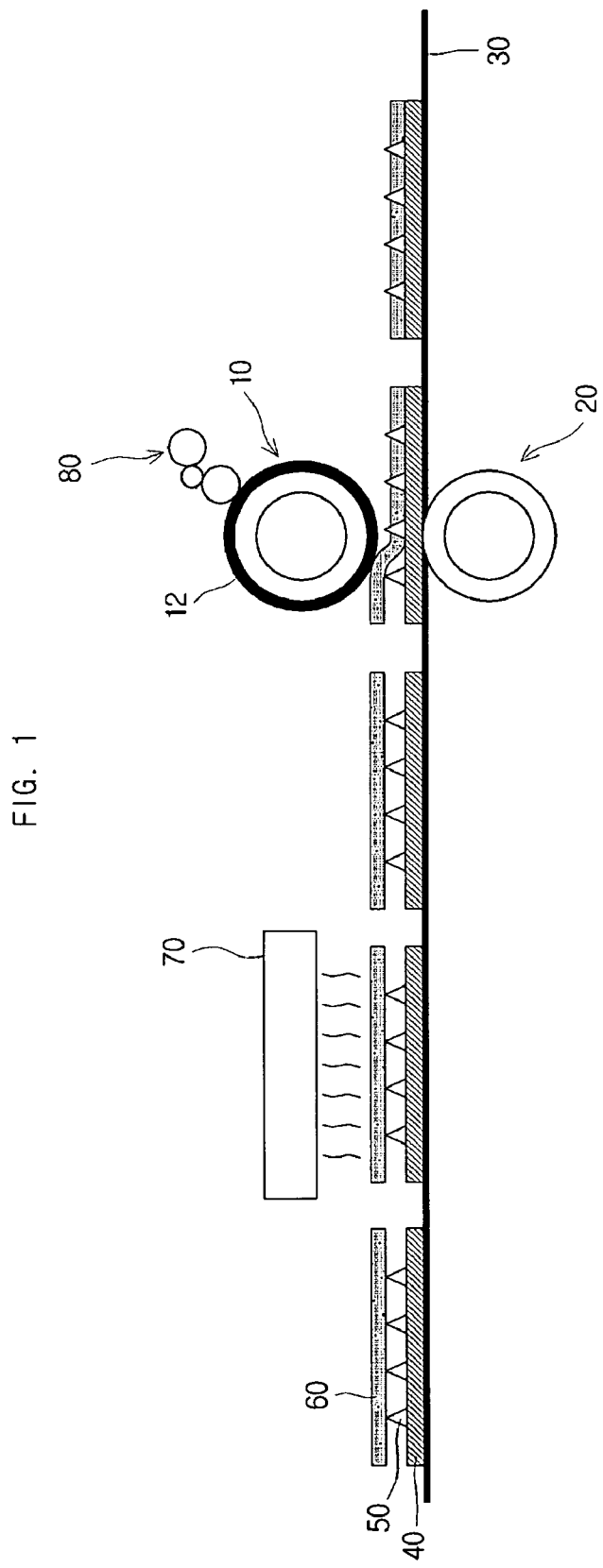
FIG. 1 is a schematic diagram illustrating one embodiment of an apparatus for manufacturing a printed circuit board according to an aspect of the invention.

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

Embodiments of the apparatus and method for manufacturing a printed circuit board according to certain aspects of the invention will now be described below in more detail with reference to the accompanying drawings. Those components that are the same or are in correspondence are rendered the same reference numeral regardless of the figure number, and redundant explanations are omitted.

First, an embodiment of an apparatus for manufacturing a printed circuit board according to an aspect of the invention will be described as follows. FIG. 1 is a schematic diagram illustrating one embodiment of an apparatus for manufacturing a printed circuit board according to an aspect of the invention. In FIG. 1, there are illustrated an upper roller 10, an elastic coating layer 12, a lower roller 20, a conveyor belt 30, boards 40, conductive bumps 50, insulators 60, a preheater 70, and cleaning rollers 80.

The upper roller 10 and the lower roller 20 may engage with each other and provide rotating motions, to press together a board 40 and an insulator 60, etc. The upper roller 10 and lower roller 20 can provide rotating motions while fixed in their respective positions. The object of pressing, such as the board 40 and the insulator 60, etc., may be provided to the upper roller 10 and lower roller 20 by way of a conveyor unit, such as the conveyor belt 30.

On the upper side of a board 40 transported by the conveyor belt 30, conductive bumps 50 may be formed, which allow interconnection between layers. When the insulator 60 and the board 40 are pressed together by the upper roller 10 and lower roller 20 described above, the conductive bumps 50 can be made to penetrate the insulator 60, to allow interconnection between the upper and lower sides of the insulator 60. Thus, in cases where pre-designed circuit patterns are formed on either side of the insulator 60, the circuit patterns (not shown) on either side may be electrically connected, due to the conductive bumps 50 that pass through the insulator 60.

The upper roller 10 and the lower roller 20 can each be made of stainless steel. On a surface of the upper roller 10, there may be formed an elastic coating layer 12. The elastic coating layer 12 formed on the surface of the upper roller 10 can be made from a silicon (Si) or Teflon material, which provides high detachability. Forming the elastic coating layer 12 from a material high in detachability can help minimize the occurrence of separation between the conductive bumps 50 and insulator 60. Of course, other heat-resistant detachable elastic materials, i.e. materials that have high elasticity and high detachability, can be used as the material for the elastic coating layer 12.

The thickness of the elastic coating layer 12 can be greater than the height of the conductive bumps 50 formed on the board 40. By forming the elastic coating layer 12 such that its thickness is greater than the height of the conductive bumps 50, the conductive bumps 50 can be prevented from being deformed due to direct contact with the upper roller 10, when the insulator 60 and the board 40 are pressed together by the upper roller 10 and the lower roller 20.

Also, in order that the bumps 50 may efficiently penetrate the insulator 60, the insulator 60 may be preheated, using a preheater 70, before the board 40 and insulator 60 are pressed together. Using the preheater 70 to preheat the insulator 60, the level of curing of the insulator 60 can be lowered, so that the insulator 60 may readily be penetrated by the conductive bumps during the pressing.

A cleaning device may be employed to remove impurities formed on the surface of the elastic coating layer 12. When the insulator 60 and the board 40 having conductive bumps 50, etc., are pressed together by the rotating motions of the lower roller 20 and upper roller 10, impurities may form on the surface of the upper roller 10, as they are separated from the conductive bumps 50 or from the insulator 60. As such, the cleaning device may be used to prevent the accumulation of such impurities, so that the pressing by the upper roller 10 and lower roller 20 may continue in an efficient manner.

This particular embodiment presents cleaning rollers 80 that engage with the upper roller 10 as an example of a cleaning device, as illustrated in FIG. 1.

Next, the operation of the apparatus for manufacturing a printed circuit board according to this embodiment will be described as follows. When the insulator 60 and the board 40 having conductive bumps 50 formed on one side are transported by the conveyor belt 30, the upper roller 10 and the lower roller 20, using rotating motions, may press the board 40 and the insulator 60 together. When the board 40 and the insulator 60 are pressed, the conductive bumps 50 formed on the board 40 penetrate the insulator 60, so that the upper and lower sides of the insulator 60 may be electrically connected.

Due to the elastic coating layer 12 formed on the surface of the upper roller 10, problems that involve the conductive bumps 50 being deformed or detached, or the insulator 60 being separated, can be minimized. Also, the elasticity of the elastic coating layer 12 can facilitate the penetrating of the insulator 60 by the conductive bumps 50.

Figure 2:
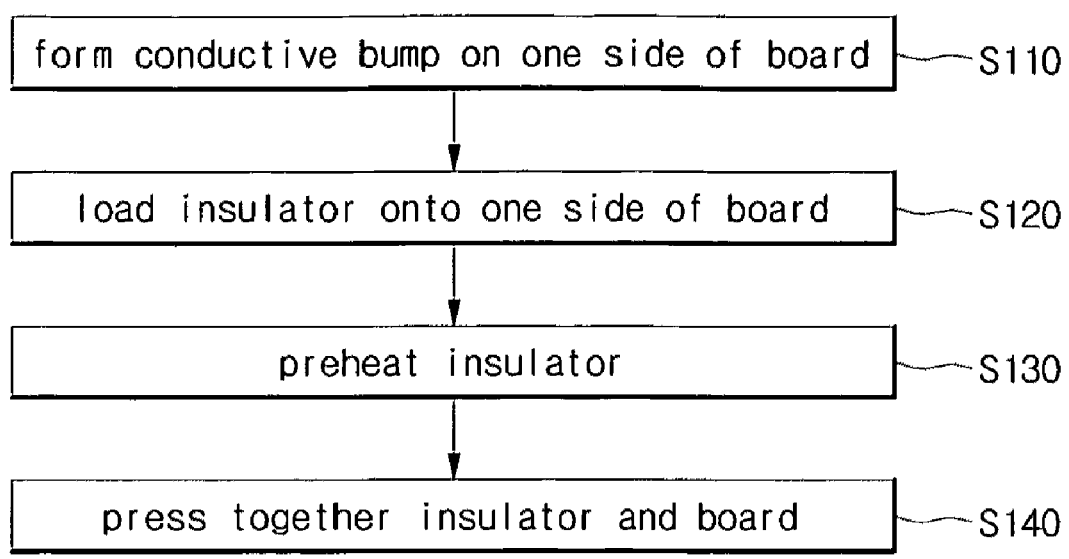
FIG. 2 is a flowchart illustrating one embodiment of a method of manufacturing a printed circuit board according to another aspect of the invention.

Next, a method of manufacturing a printed circuit board according to another aspect of the invention will be described as follows with reference to FIG. 2. For better understanding, the method will be described for an example that uses the apparatus for manufacturing a printed circuit board described above. FIG. 2 is a flowchart illustrating one embodiment of a method of manufacturing a printed circuit board according to another aspect of the invention.

First, conductive bumps 50 may be formed on one side of a board 40 (S110), and an insulator 60 may be loaded onto the side of the board 40 (S120). The conductive bumps 50 may penetrate the insulator 60 and may serve to electrically connect either side of the insulator 60. These conductive bumps 50 can be formed on one side of the board 40 using an inkjet method or a screen printing method, etc.

Next, the insulator 60 and the board 40 may be pressed together (S140). By thus pressing the insulator 60 and the board 40, the conductive bumps 50 can be made to penetrate the insulator 60.

Before pressing the insulator 60 and the board 40, the insulator 60 may be preheated (S130), in order that the insulator 60 may readily be penetrated by the conductive bumps 50. By preheating the insulator 60 using the preheater 70, the level of curing of the insulator 60 may be lowered, so that the conductive bumps 50 can be made to penetrate the insulator 60 with greater ease, during the pressing.

As described above, the process of pressing the insulator 60 and the board 40 can be performed by a lower roller 20 that supports the board 40, and an upper roller 10 that engages with the lower roller 20 and has an elastic coating layer 12 formed on the surface.

The elastic coating layer 12 formed on the surface of the upper roller 10 can be made of a silicon (Si) or Teflon material, which is high in detachability, and the thickness of the elastic coating layer 12 can be made greater than the height of the conductive bumps 50, as already described above.

According to certain embodiments of the invention as set forth above, there is no need for a separate device to perform a cushioning function and a detaching function between the bumps and the rollers, while the rollers can be kept clean using the cleaning device.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above are encompassed within the scope of claims of the present invention.

What is claimed is:

1. An apparatus for manufacturing a printed circuit board employing conductive bumps for interconnection between layers, the apparatus comprising:
   a conveyor unit configured to transport a board, the board having the conductive bumps formed on one side thereof;
   an upper roller and a lower roller configured to press together the board and an insulator;
   an elastic coating layer formed on a surface of the upper roller and having a thickness greater than a height of the conductive bumps;
   a cleaning device configured to remove impurities from a surface of the elastic coating layer, the cleaning device comprising a cleaning roller configured to engage with the upper roller; and
   a preheater configured to preheat the insulator.

2. The apparatus of claim 1, wherein the elastic coating layer contains silicon (Si) or Teflon.

* * * * *